United States Patent
Mao et al.

(10) Patent No.: US 11,018,632 B2
(45) Date of Patent: May 25, 2021

(54) ENVELOPE TRACKING POWER AMPLIFIER MODULE AND ENVELOPE TRACKING METHOD FOR THE SAME

(71) Applicant: iWave Technologies Co., Ltd., Kaohsiung (TW)

(72) Inventors: Shau-Gang Mao, Kaohsiung (TW); Chong-Yi Liou, Kaohsiung (TW); Wei-Ting Tsai, Kaohsiung (TW); Yu-Yao Chen, Kaohsiung (TW); Zheng-An Peng, Kaohsiung (TW); Shih-Ping Huang, Kaohsiung (TW); Chien-Bang Chen, Kaohsiung (TW)

(73) Assignee: IWAVE TECHNOLOGIES CO., LTD., Kaohsiung (TW)

( * ) Notice: Subject to any disclaimer, the term of this patent is extended or adjusted under 35 U.S.C. 154(b) by 98 days.

(21) Appl. No.: 16/528,949

(22) Filed: Aug. 1, 2019

(65) Prior Publication Data
US 2021/0036664 A1    Feb. 4, 2021

(51) Int. Cl.
| H03F 1/32 | (2006.01) |
| H03F 3/21 | (2006.01) |
| H04B 1/04 | (2006.01) |

(52) U.S. Cl.
CPC .......... *H03F 1/32* (2013.01); *H03F 3/21* (2013.01); *H04B 1/0475* (2013.01); *H03F 2200/105* (2013.01); *H04B 2001/0425* (2013.01)

(58) Field of Classification Search
CPC ...................................................... H03F 1/32
See application file for complete search history.

(56) References Cited

U.S. PATENT DOCUMENTS

| 6,252,455 | B1 * | 6/2001 | Kurby et al. | H03G 3/20 |
| 6,256,482 | B1 * | 7/2001 | Raab | H04B 1/04 |
| 9,098,099 | B2 * | 8/2015 | Park et al. | G05F 3/08 |
| 2004/0266366 | A1 * | 12/2004 | Robinson et al. | H04B 1/02 |
| 2005/0242875 | A1 * | 11/2005 | Gurvich et al. | H03G 3/20 |
| 2008/0139140 | A1 * | 6/2008 | Matero et al. | H04B 1/04 |
| 2010/0233977 | A1 * | 9/2010 | Minnis et al. | H04B 1/04 455/127.1 |
| 2015/0031318 | A1 * | 1/2015 | McCallister | H03F 1/3247 |
| 2018/0102750 | A1 * | 4/2018 | Watkins et al. | H03F 3/193 |

* cited by examiner

*Primary Examiner* — Patricia T Nguyen
(74) *Attorney, Agent, or Firm* — Birch, Stewart, Kolasch & Birch, LLP

(57) ABSTRACT

An envelope tracking power amplifier module and an envelope tracking method are provided. The envelope tracking power amplifier module includes a power amplifier and a linear amplifier coupled to the power amplifier and configured to receive and amplify an envelope signal and provide the amplified envelope signal to the power amplifier. The power amplifier is configured to receive and amplify a signal according to the amplified envelope signal. The envelope tracking method includes: providing a signal to the power amplifier; deriving an envelope phase of the signal, the envelope phase corresponding to an output power of the power amplifier; providing an envelope signal including the envelope phase to the envelope tracking module; the envelope tracking module providing the amplified envelope signal to the power amplifier; and the power amplifier amplifying the signal according to the amplified envelope signal and outputting the amplified signal at the output power.

11 Claims, 13 Drawing Sheets

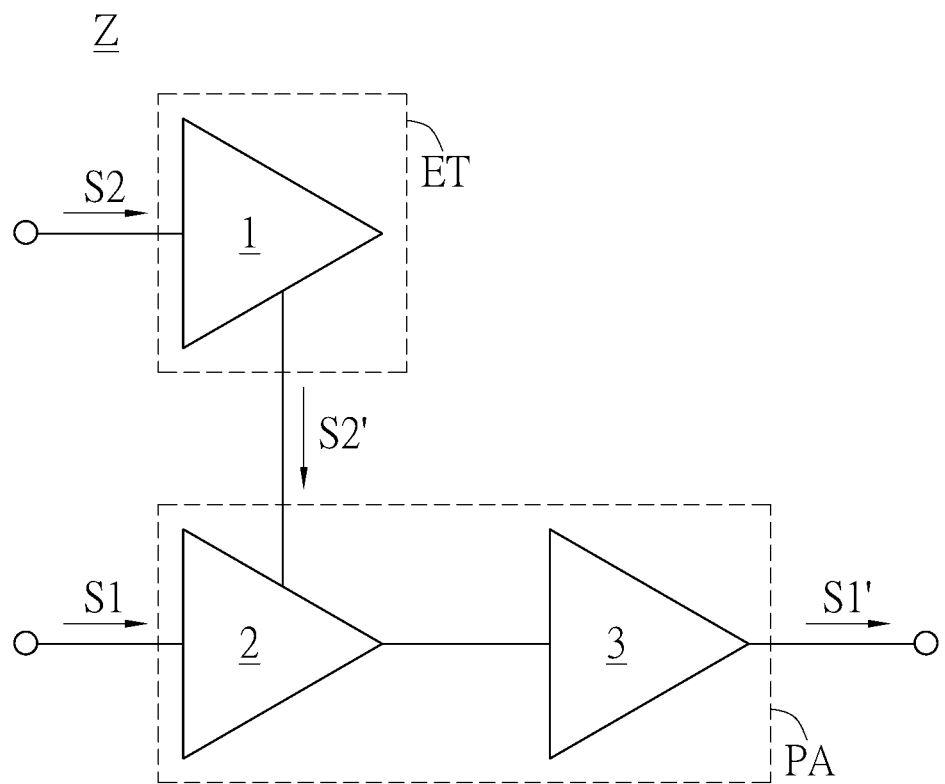
【FIG.1】

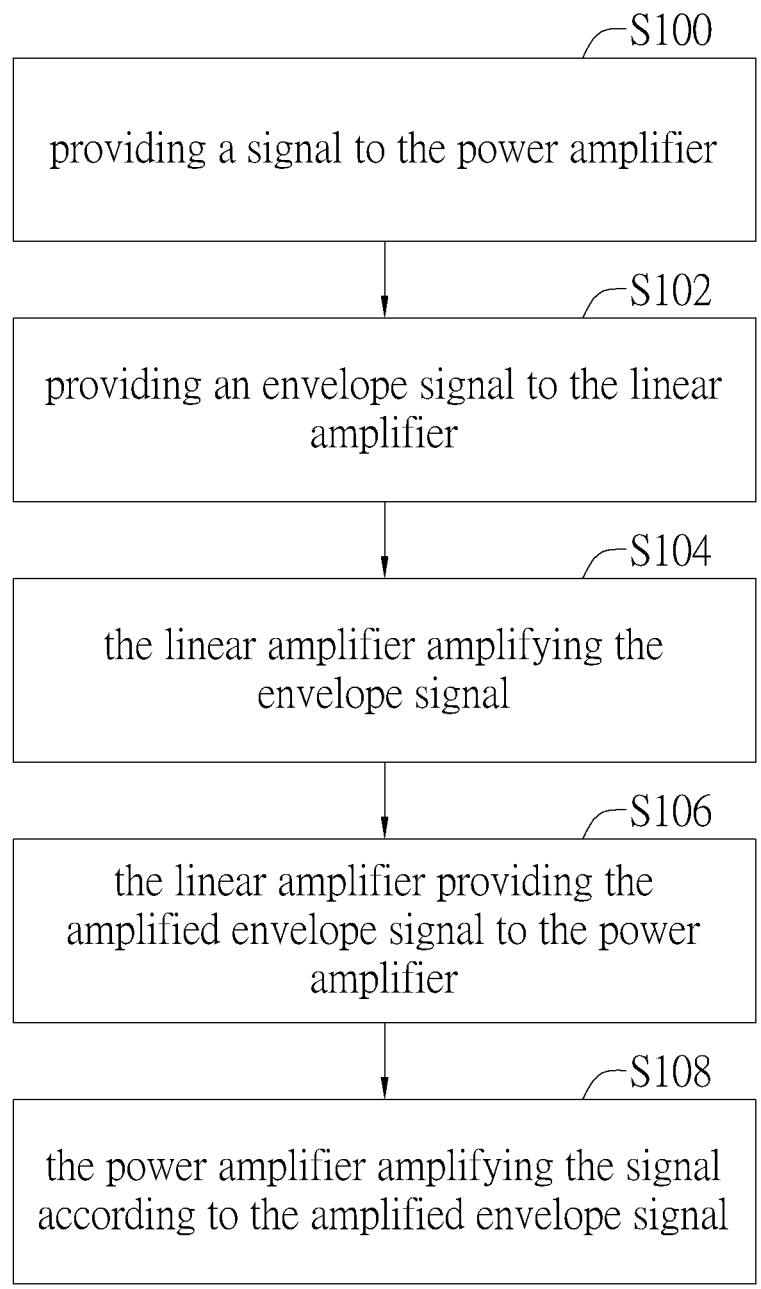
[FIG.2]

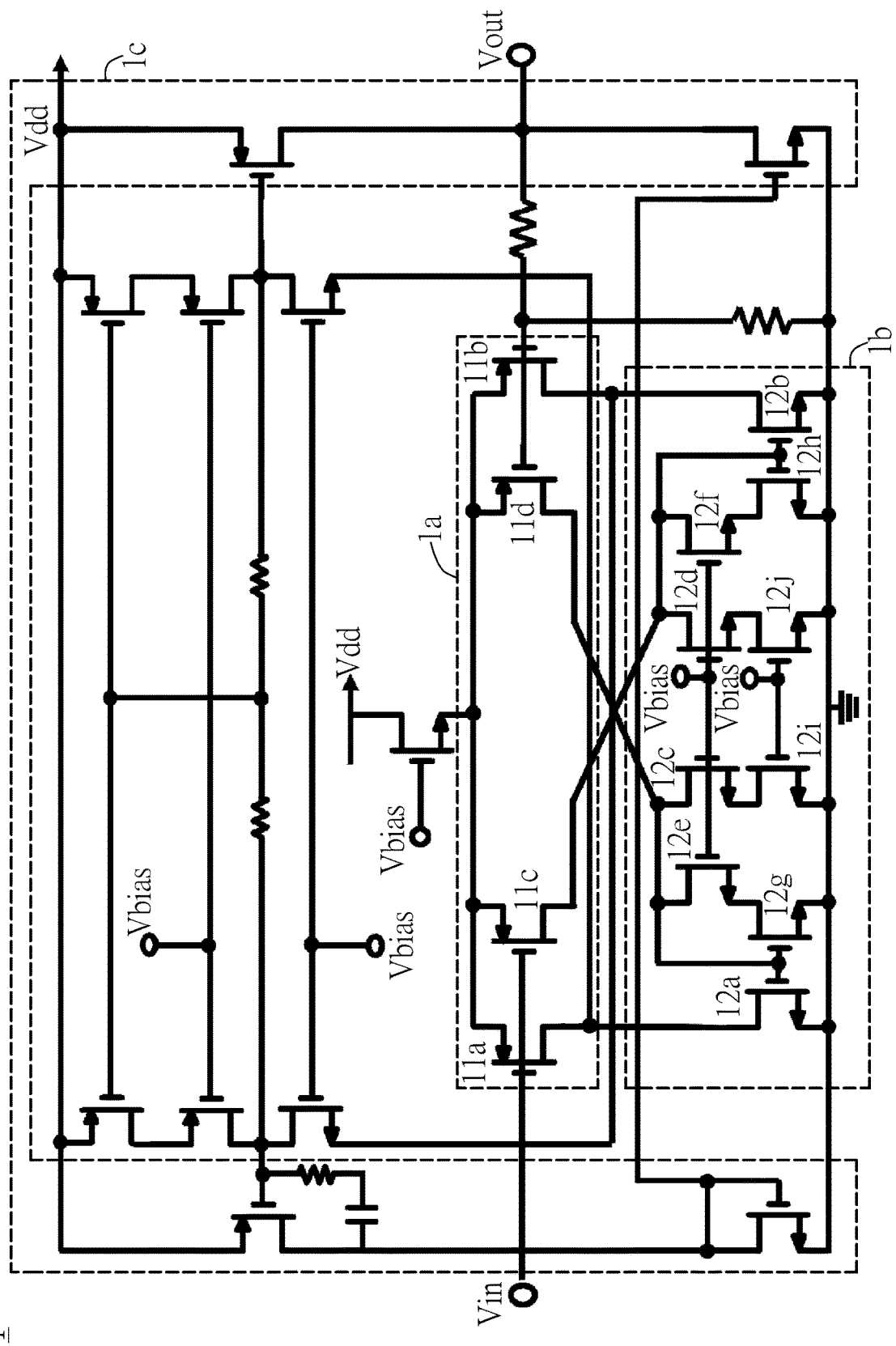
[FIG.3]

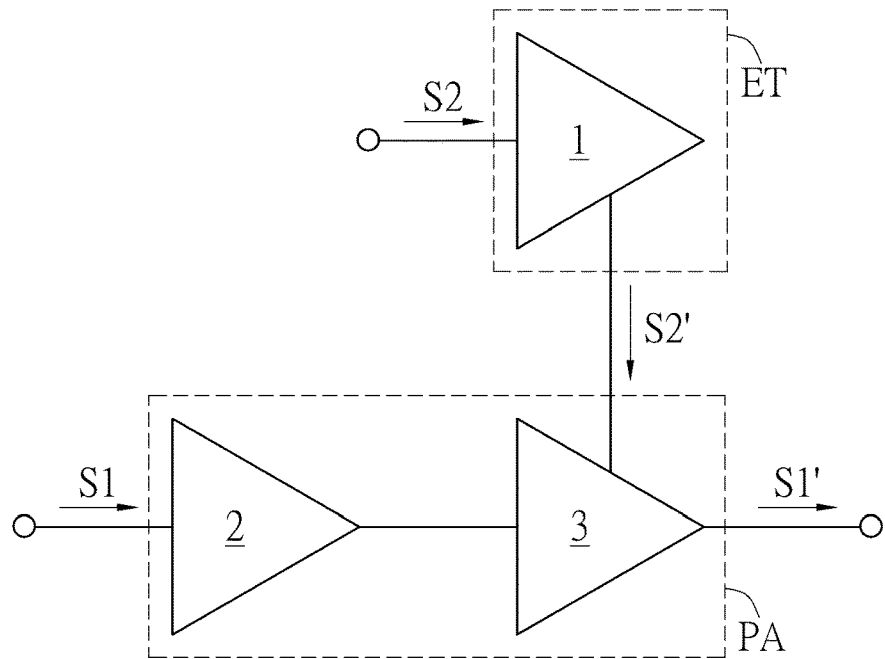
【FIG.4】
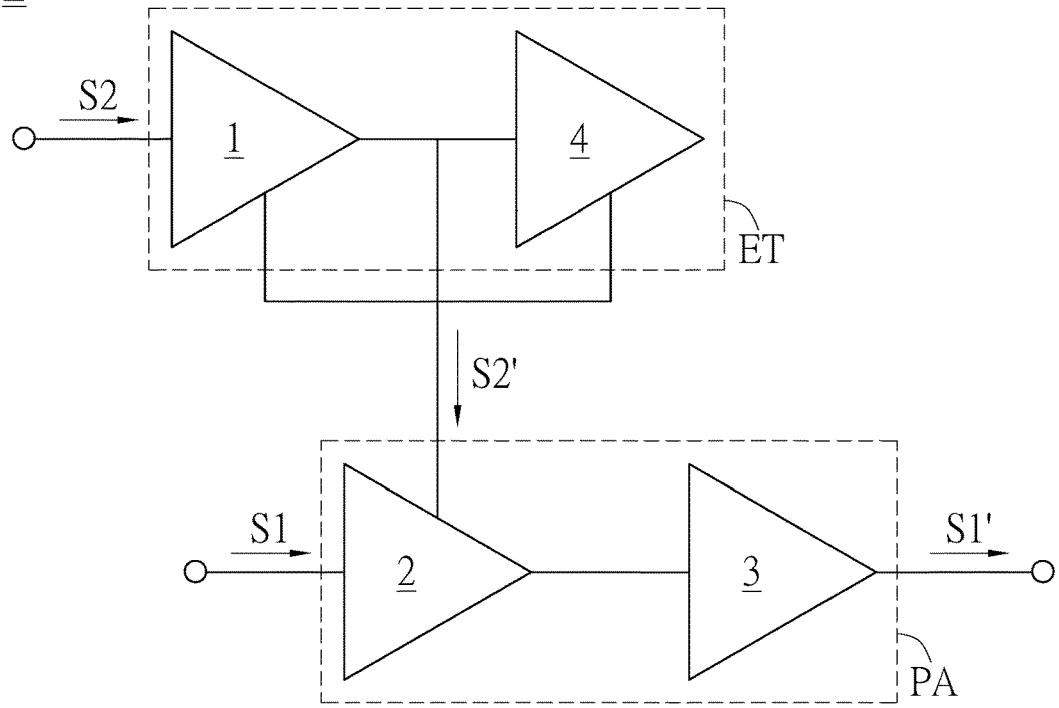
【FIG.5】

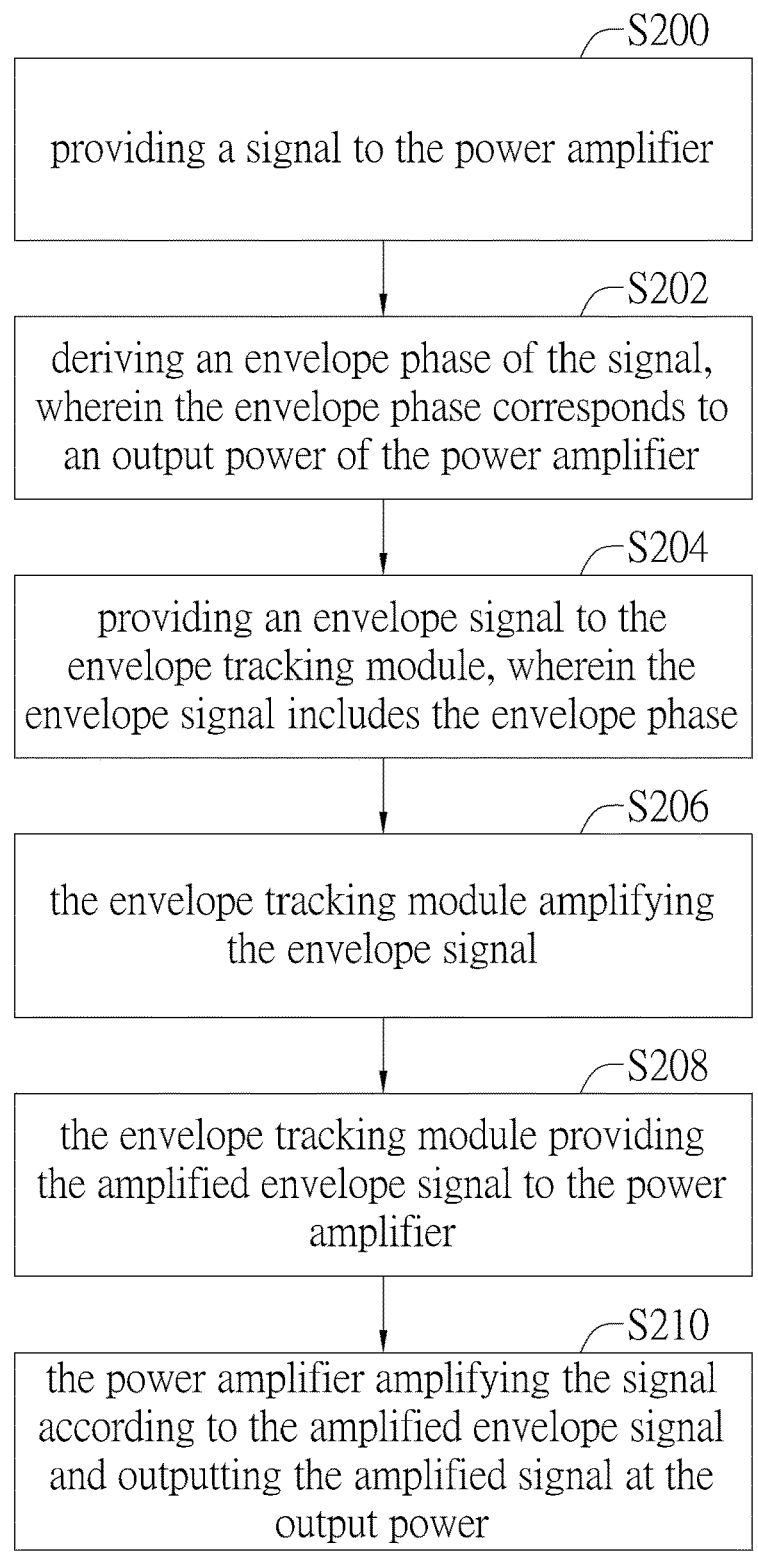
[FIG.6]

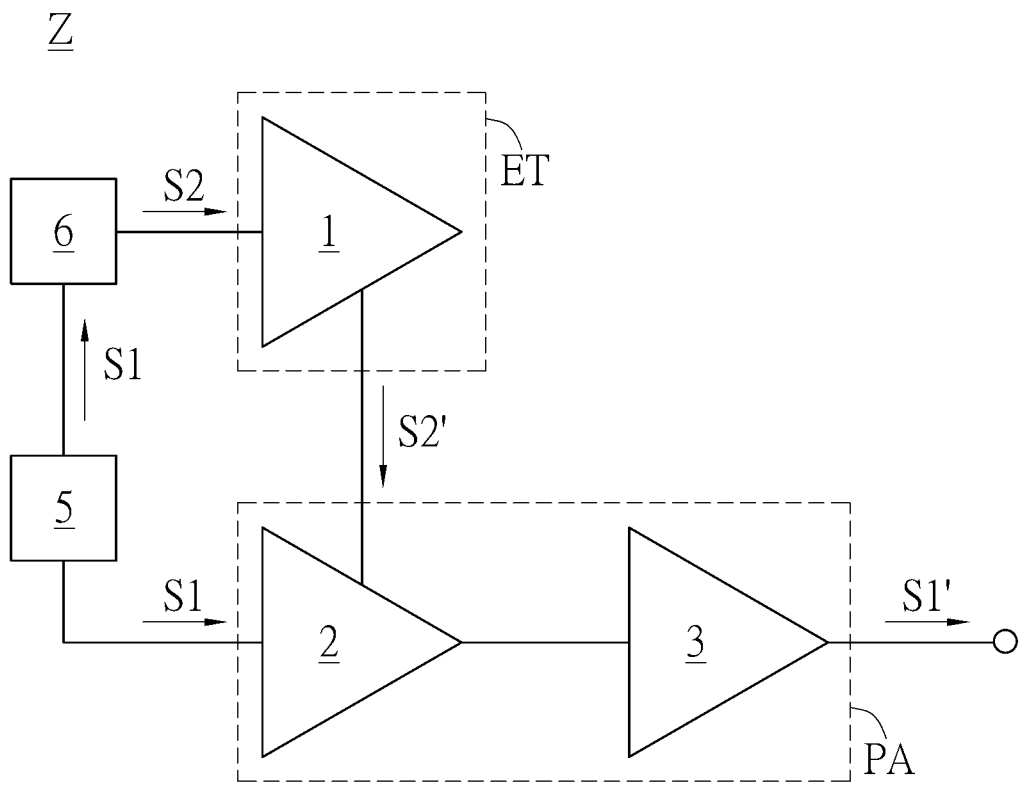
【FIG.7】

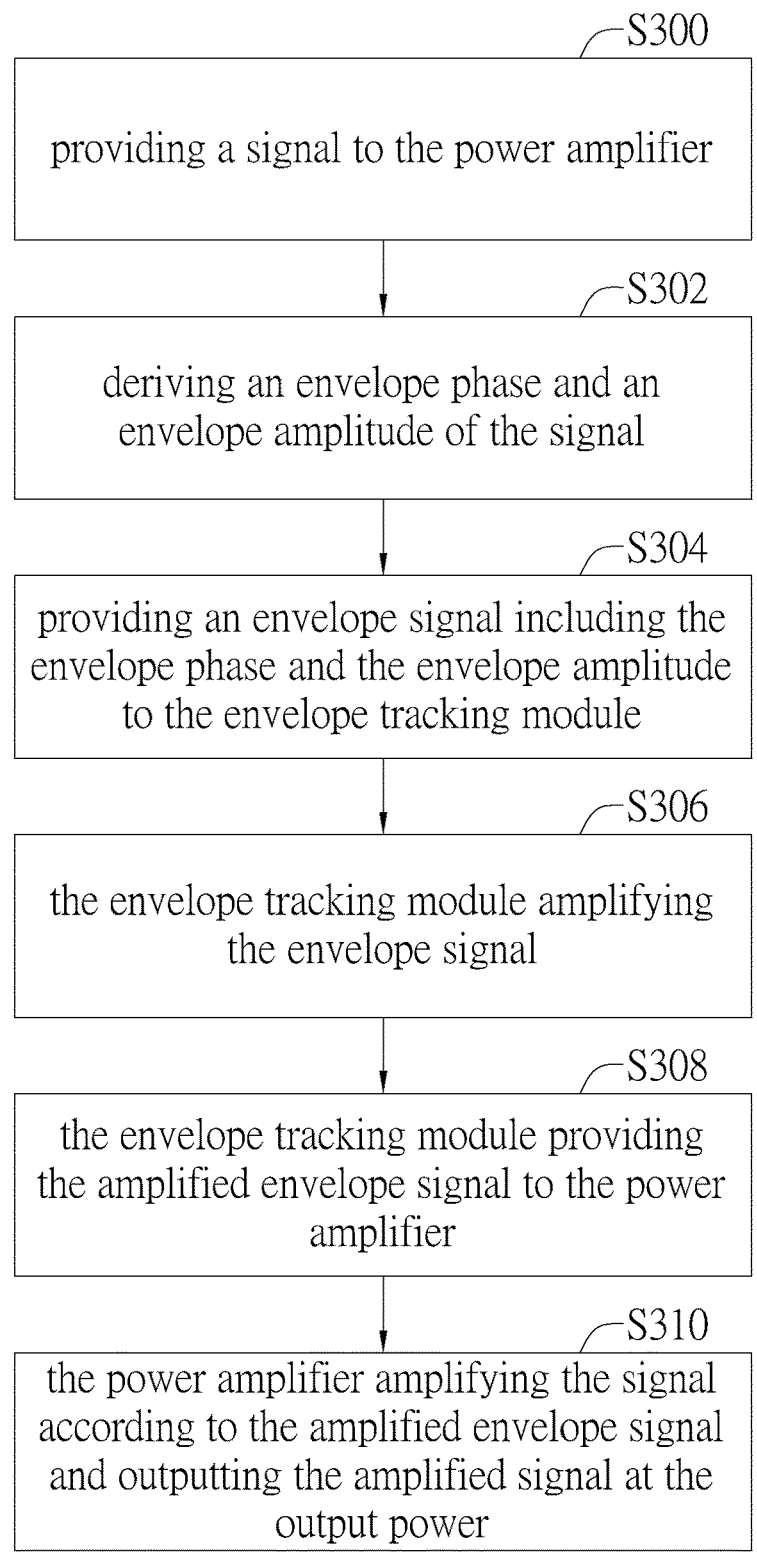
[FIG.8]

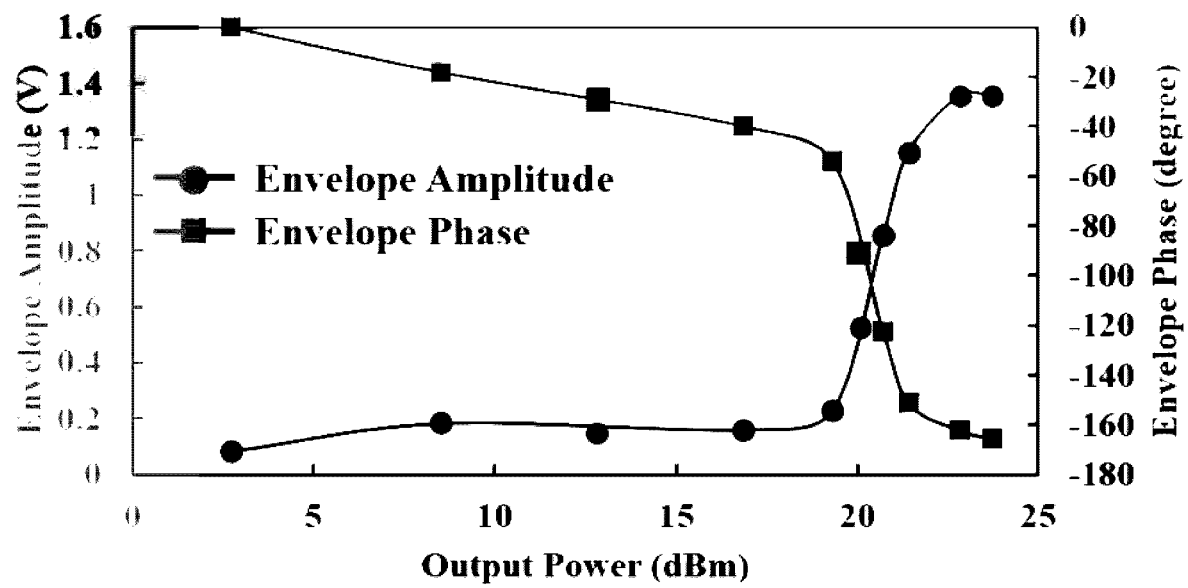
【FIG.9A】
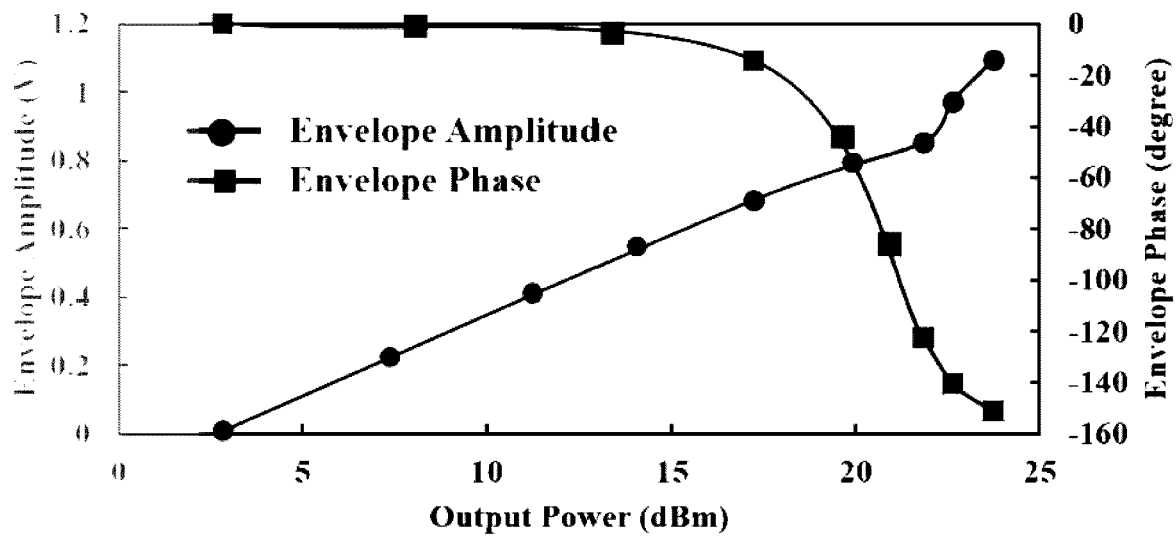
【FIG.9B】

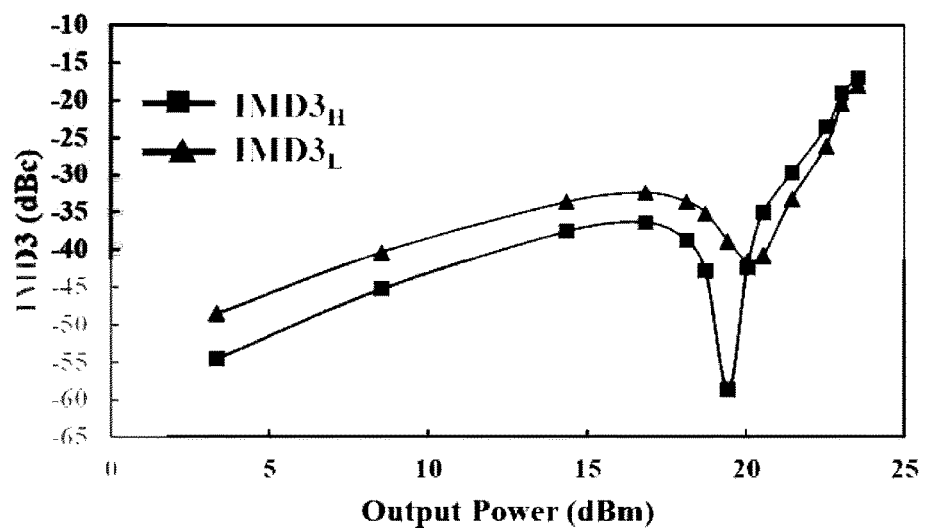
【FIG.10A】
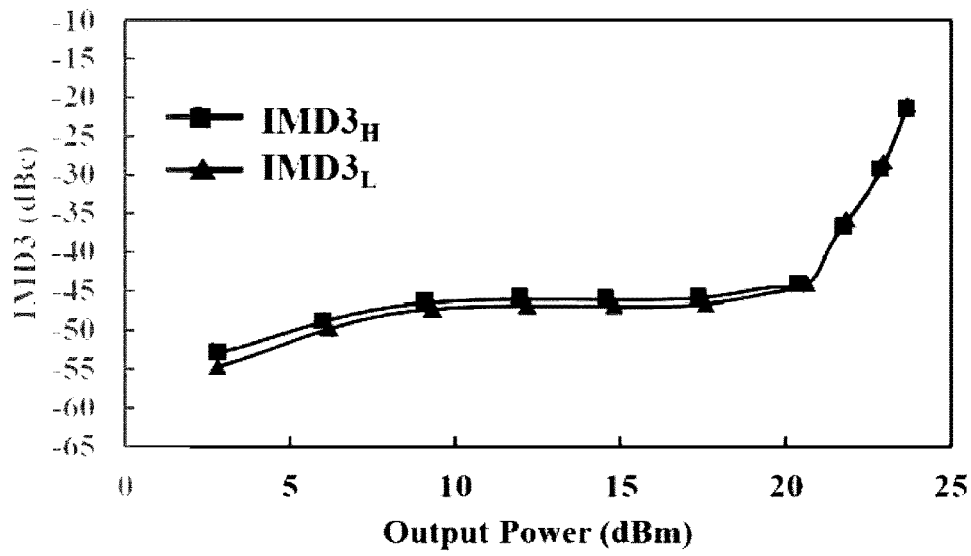
【FIG.10B】
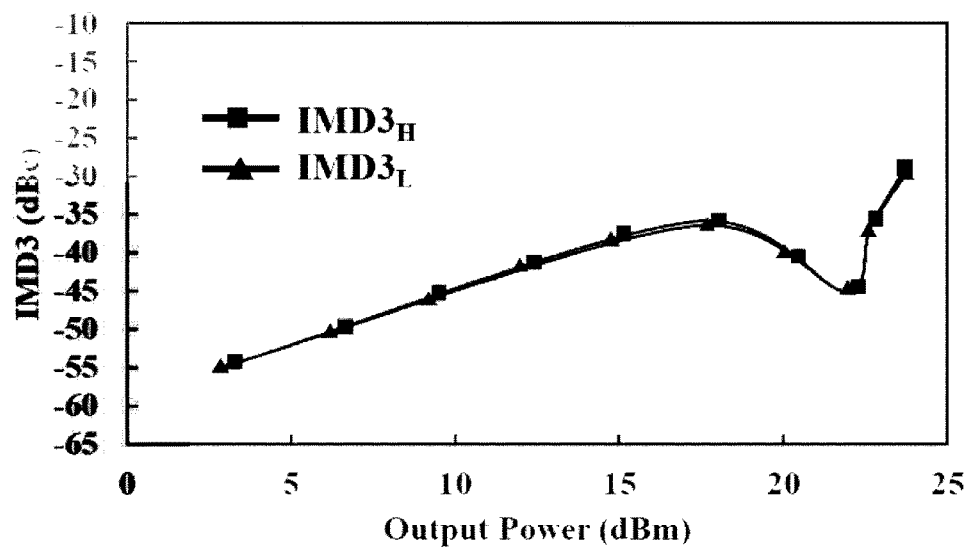
【FIG.10C】

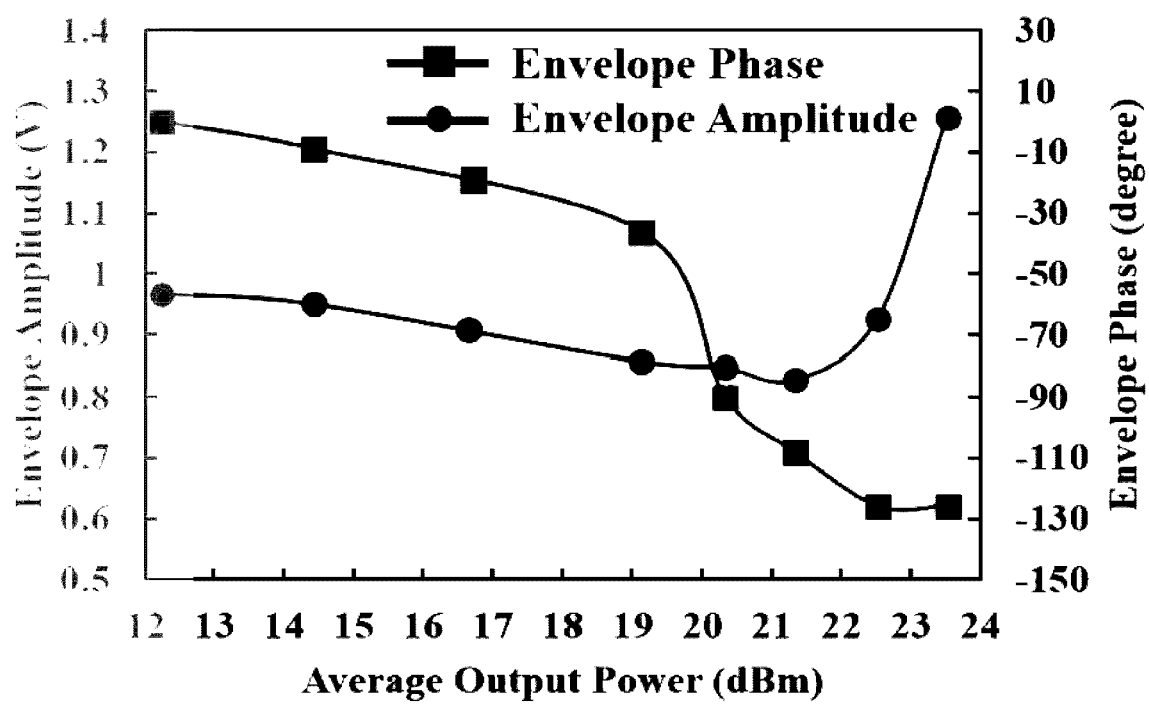
【FIG.11】

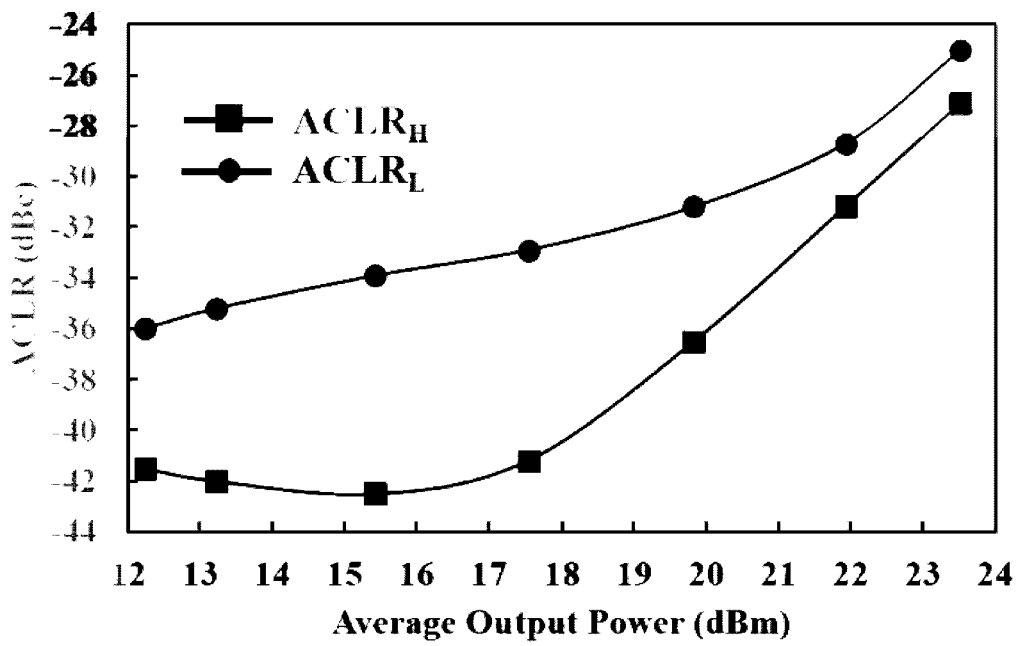
【FIG.12A】
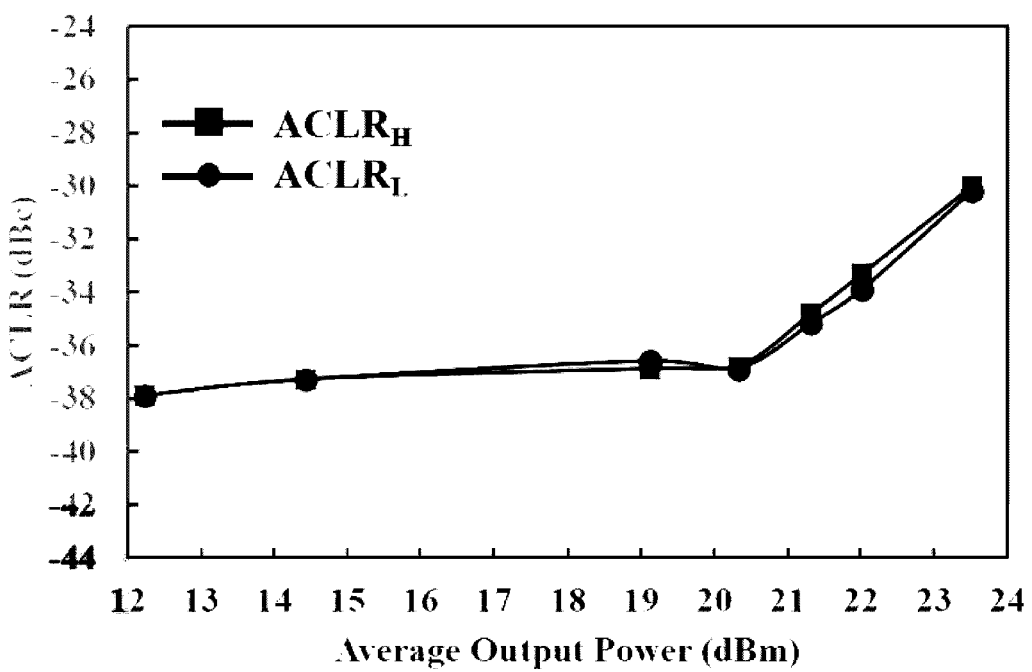
【FIG.12B】

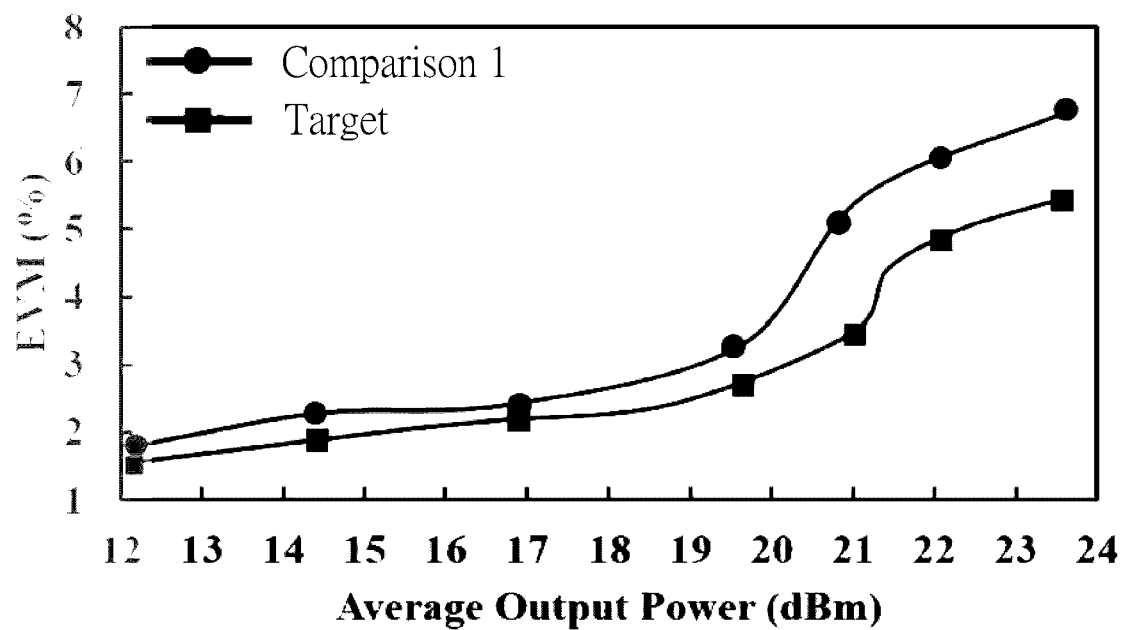
【FIG.13】

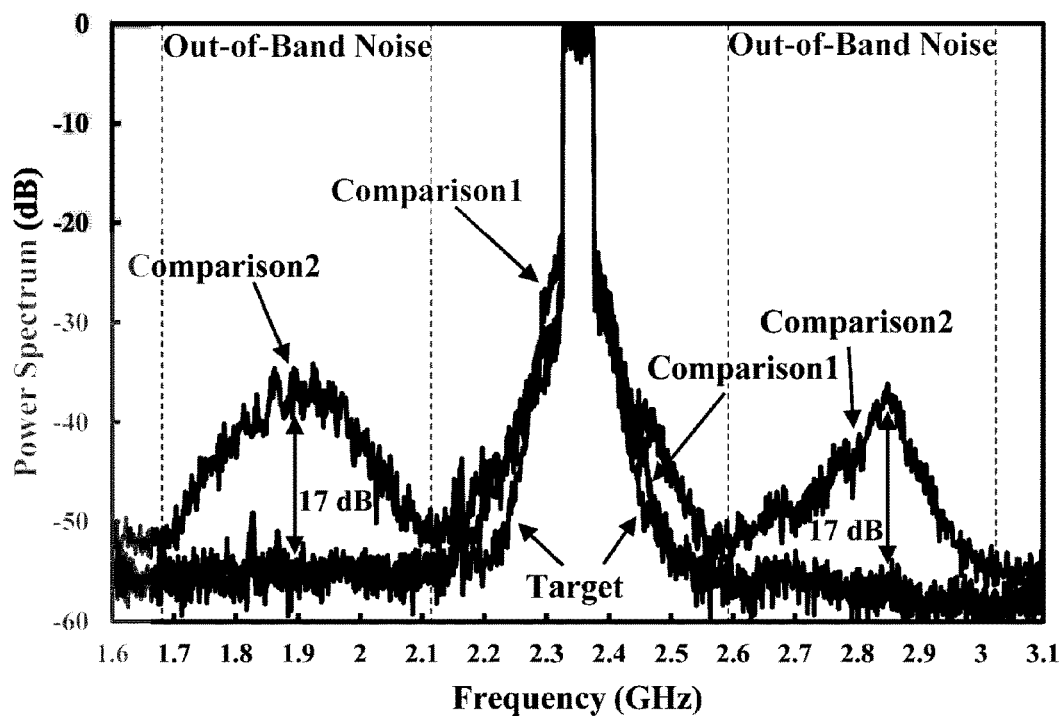
【FIG.14A】
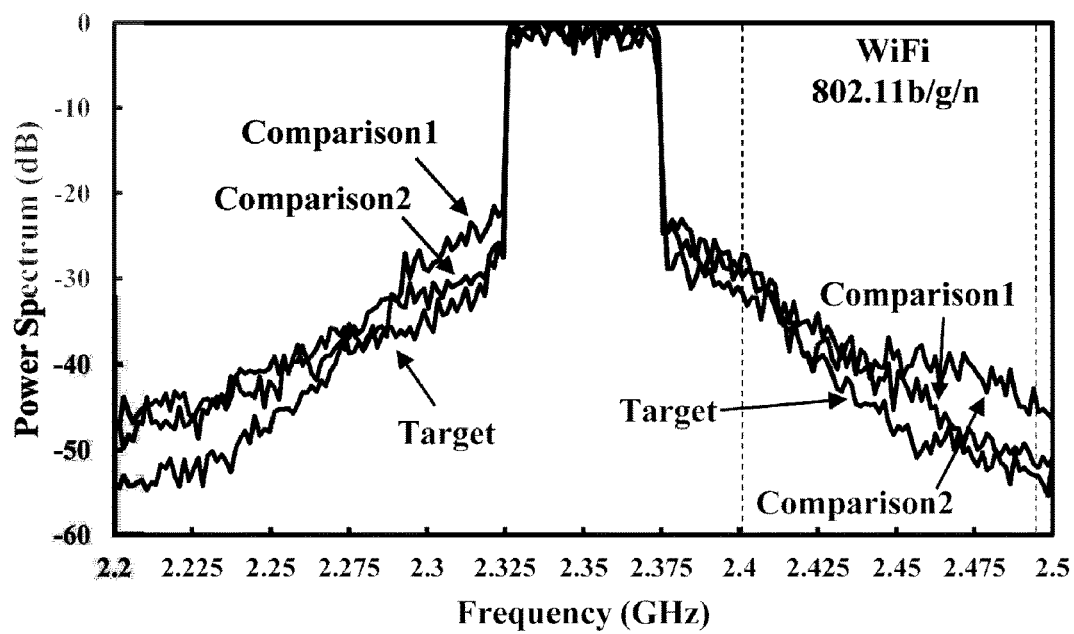
【FIG.14B】

ENVELOPE TRACKING POWER AMPLIFIER MODULE AND ENVELOPE TRACKING METHOD FOR THE SAME

FIELD OF THE INVENTION

The present invention relates to an envelope tracking power amplifier module and an envelope tracking method for the same, and specifically to an envelope tracking power amplifier module and an envelope tracking method providing enhanced linearity performance.

BACKGROUND OF THE INVENTION

As wireless communication technology develops, there is an increased need for power amplifiers operating with high efficiency and high linearity to meet the performance requirements of modern communication systems such as the fourth generation (4G) and fifth generation (5G) wireless communication standards.

Envelope tracking technique is among the technical solutions used to enhance the efficiency and linearity performance of power amplifiers. A conventional envelope tracking module usually includes a linear amplifier and a switching amplifier, in which the linear amplifier outputs signals proportional to its input signals at increased power levels, and the switching amplifier provides current source to the power amplifier. Prior art envelope tracking power amplifiers (ETPAs) can be classified into two types, two-stage ETPA, wherein the envelope tracking module is connected to both the driver stage and the power stage of a power amplifier, and power-stage ETPA, wherein the envelope tracking module is solely connected to the power stage of a power amplifier.

One of the challenges in adapting to modern communication standards is to enhance the linearity performance of two-stage ETPAs. In the prior art, power-stage ETPA with digital predistortion (DPD) technology has been proposed to reduce the ACLR. However, DPD method has limitations since it may result in the high cost of additional components required to perform DPD, increased size of the communication devices, and limited operating bandwidth. Another issue with respect to prior art ETPAs is the out-of-band noise signals caused by the switching amplifier of conventional envelope tracking modules, which may interfere with transmissions on other frequency bands.

SUMMARY OF THE INVENTION

In light of the above, one of the objectives of the present invention is to provide an envelope tracking power amplifier module and an envelope tracking method that provide enhanced linearity performance and reduce out-of-band noise.

One embodiment of the present invention provides an envelope tracking power amplifier module including a power amplifier and a linear amplifier coupled to the power amplifier. The linear amplifier is configured to receive and amplify an envelope signal and provide the amplified envelope signal to the power amplifier. The power amplifier is configured to receive and amplify a signal according to the amplified envelope signal.

Another embodiment of the present invention provides an envelope tracking power amplifier module including a power amplifier having a driver stage and a power stage, and an envelope tracking module coupled to the driver stage of the power amplifier and configured to receive and amplify an envelope signal and provide the amplified envelope signal to the driver stage. The power amplifier is configured to receive and amplify a signal according to the amplified envelope signal.

Another embodiment of the present invention provides an envelope tracking method for an envelope tracking power amplifier module including a power amplifier and an envelope tracking module coupled to the power amplifier. The method includes: providing a signal to the power amplifier; deriving an envelope phase of the signal, wherein the envelope phase corresponds to an output power of the power amplifier; providing an envelope signal to the envelope tracking module, wherein the envelope signal includes the envelope phase; the envelope tracking module amplifying the envelope signal; the envelope tracking module providing the amplified envelope signal to the power amplifier; and the power amplifier amplifying the signal according to the amplified envelope signal and outputting the amplified signal at the output power.

Another embodiment of the present invention provides an envelope tracking method for an envelope tracking power amplifier module including a power amplifier and a linear amplifier, the linear amplifier being coupled to the power amplifier. The method includes: providing a signal to the power amplifier; providing an envelope signal to the linear amplifier; the linear amplifier amplifying the envelope signal; the linear amplifier providing the amplified envelope signal to the power amplifier; and the power amplifier amplifying the signal according to the amplified envelope signal.

To further learn the features and technical content of the present invention, please refer to the following detailed descriptions and drawings related to the present invention. However, the provided drawings are used only for providing reference and descriptions, and are not intended to limit the present invention.

BRIEF DESCRIPTION OF THE DRAWINGS

FIG. 1 is a schematic view illustrating an envelope tracking power amplifier module according to a first embodiment of the present invention.

FIG. 2 is a flow chart illustrating an envelope tracking method using the envelope tracking power amplifier module of FIG. 1 according to the first embodiment of the present invention.

FIG. 3 is a schematic view illustrating the linear amplifier of the first embodiment of the present invention.

FIG. 4 is a varied embodiment according to the first embodiment of the present invention.

FIG. 5 is a schematic view illustrating an envelope tracking power amplifier module according to a second embodiment of the present invention.

FIG. 6 is a flow chart illustrating an envelope tracking method for an envelope tracking power amplifier module according to a third embodiment of the present invention.

FIG. 7 is a schematic view illustrating the envelope tracking power amplifier module using the method of FIG. 6 according to the third embodiment of the present invention.

FIG. 8 is a varied embodiment of the envelope tracking method according to the third embodiment of the present invention.

FIG. 9A shows the amplitude shaping function and the phase shaping function for the embodiment of FIG. 4.

FIG. 9B shows the amplitude shaping function and the phase shaping function for the embodiment of FIG. 1.

FIG. 10A, FIG. 10B and FIG. 10C respectively show measured third-order intermodulation distortions (IMD3) of a comparative example, the embodiment of FIG. 4 using the amplitude shaping function and the phase shaping function of FIG. 9A, and the embodiment of FIG. 1 using the amplitude shaping function and the phase shaping function of FIG. 9B.

FIG. 11 shows the amplitude shaping function and the phase shaping function for the envelope tracking power amplifier module of FIG. 1 for 2.35 GHz 5G NR TDD signal with 256-QAM and 50-MHz bandwidth.

FIG. 12A and FIG. 12B respectively show measured ACLR of the comparative example and that of the embodiment of FIG. 1 using the amplitude shaping function and the phase shaping function of FIG. 11 for 2.35 GHz 5G NR TDD signal with 256-QAM and 50-MHz bandwidth.

FIG. 13 shows measured error vector magnitude (EVM) of a comparative example and that of the embodiment of FIG. 1 using the amplitude shaping function and the phase shaping function of FIG. 11 for 2.35 GHz 5G NR TDD signal with 256-QAM and 50-MHz bandwidth.

FIG. 14A and FIG. 14B show measured power spectra of the embodiment of FIG. 1 using the amplitude shaping function and the phase shaping function in FIG. 11, and the power spectrum of two other comparative examples within different frequency ranges.

DETAILED DESCRIPTION OF THE PREFERRED EMBODIMENTS

Embodiments of the present invention are described below with reference to FIG. 1 to FIG. 14B. A person skilled in the art can understand the advantages and effects of the present invention from the description disclosed below. However, the content disclosed below is not intended to limit the protection scope of the present invention. The present invention can be implemented by a person skilled in the art based on different perspectives and applications without departing from the concept and spirit of the present invention. In addition, it should be stated in advance that the accompanying drawings of the present invention are merely used for illustration and are not drawn according to actual dimensions. Moreover, although terms, such as first, second, and third, may be used to describe various components, the component should not be limited by the terms. Said terms are used to distinguish different components.

First Embodiment

Reference is made to FIG. 1 to FIG. 4 to describe the first embodiment of the present invention. Referring first to FIG. 1, the first embodiment of the present invention provides an envelope tracking power amplifier module Z. The envelope tracking power amplifier module Z includes a power amplifier PA and a linear amplifier 1. The linear amplifier 1 is coupled to the power amplifier PA and configured to receive and amplify an envelope signal S2 and provide the amplified envelope signal S2' to the power amplifier PA. The power amplifier PA is configured to receive and amplify a signal S1 according to the amplified envelope signal S2'.

As shown in FIG. 1, in this embodiment, the linear amplifier 1 serves as an envelope tracking module ET that provides the power amplifier PA with supply voltage with dynamically adjusted amplitude according to the envelope signal S2 of the signal S1.

More specifically, with further reference to FIG. 2, the present embodiment provides an envelope tracking method applicable to the envelope tracking power amplifier module Z of FIG. 1. The envelope tracking method of the present embodiment includes at least the following steps: step S100: providing a signal S1 to the power amplifier PA; step S102: providing an envelope signal S2 to the linear amplifier 1; step S104: the linear amplifier 1 amplifying the envelope signal S2; step S106: the linear amplifier 1 providing the amplified envelope signal S2' to the power amplifier PA; and step S108: the power amplifier PA amplifying the signal S1 according to the amplified envelope signal S2'.

The present embodiment is characterized in that, with the technical solution disclosed above, the envelope tracking power amplifier module Z of the present embodiment can dispense with the use of a switching amplifier usually included in a conventional envelope tracking module. The switching amplifier contributes to out-of-band noise and thus may interfere with data transmissions in other frequency bands. In addition, noise generated by the switching amplifier at its switching frequency limits the bandwidth of the linear amplifier. Therefore, with the technical solution of the present embodiment, the present embodiment reduces the level of out-of-band noise and exhibits higher bandwidth compared with a conventional envelope tracking power amplifier. Specifically, in the present embodiment, the operational bandwidth of the linear amplifier 1 is 536 MHz. However, the present invention is not limited thereto.

Furthermore, the switching amplifier in a conventional envelope tracking module includes an off-chip inductor at its output, which reduces the efficiency of the power amplifier. The present embodiment dispenses with the switching amplifier and hence the off-chip inductor, improving the efficiency of the power amplifier PA, reducing the cost of the envelope tracking module ET and saving the space that the envelope tracking module ET would otherwise occupy.

Referring to FIG. 3, the circuit structure of the linear amplifier 1 of the present embodiment will be described below. However, the present invention is not limited thereto. The linear amplifier 1 of the present embodiment includes an input stage 1a, an amplification stage 1b, and an output stage 1c. The input stage 1a has at least one pair of input transistors (11a, 11b), (11c, 11d). The amplification stage 1b has at least one pair of amplification transistors (12a, 12b), (12c, 12d) . . . (12i, 12j). The amplification transistor pairs are in parallel connection with each other. More specifically, as shown in FIG. 3, the amplification transistors are arranged in two stages, wherein the amplification transistor pairs (12c, 12d), (12e, 12f) are arranged in the upper stage and in parallel connection with each other, and the amplification transistor pairs (12a, 12b), (12g, 12h), (12i, 12j) are arranged in the lower stage and in parallel connection with each other.

Furthermore, one pair of the input transistors (11a, 11b) of the input stage 1a is in direct-cascade connection with one pair of the amplification transistors (12a, 12b) of the amplification stage 1b; one pair of the input transistors (11c, 11d) of the input stage 1a is in cross-cascade connection with one pair of the amplification transistors (12c, 12d) of the amplification stage 1b. With the structural manner stated above, an input signal flows through the left transistor 11c of the input transistor pair (11c, 11d) and passes through the right transistor 12d of the amplification transistor pair (12c, 12d), and another input signal flows through the right transistor 11d of the input transistor pair (11c, 11d) and passes through the left transistor 12c of the amplification transistor pair (12c, 12d). In this manner, the differential input signals can be amplified twice respectively by the amplification transistor pair (12a, 12b).

The use of cross-cascade connection structure in the linear amplifier 1 of the present embodiment can achieve high linearity for high bandwidth data transmission [Non-patent citation 1].

In FIG. 3, the direct-cascade connection and the cross-cascade connection are applied between different pairs of input transistors and different pairs of amplification transistors, i.e. between the input transistor pair (11*a*, 11*b*) and the amplification transistor pair (12*a*, 12*b*), and between the input transistor pair (11*c*, 11*d*) and the amplification transistor pair (12*c*, 12*d*). However, the present invention is not limited thereto. For example, in one embodiment, the direct-cascade connection and the cross-cascade connection can be both applied between the input transistor pair (11*a*, 11*b*) and the amplification transistor pair (12*a*, 12*b*). In addition, the input stage 1*a* and the amplification stage 1*b* of the linear amplifier 1 in FIG. 3 include more than one transistor pairs. However, the present invention is not limited thereto. For instance, in other embodiments, the input stage 1*a* and the amplification stage 1*b* can each include one pair of transistors, in which the input transistor pair is in direct-cascade and cross-cascade connections with the amplification transistor pair.

In the embodiment shown in FIG. 1, the power amplifier PA includes a driver stage 2 and a power stage 3, and the linear amplifier 1 is connected to the driver stage 2. In this condition, step 106 refers to the linear amplifier 1 providing the amplified envelope signal S2' to the driver stage 2. However, the present invention is not limited thereto. For example, in some embodiments, the power amplifier PA can include only the power stage 3, and in other embodiments, the power amplifier PA can include more than one driver stage. Furthermore, referring to FIG. 4, in a varied embodiment, the linear amplifier 1 can be connected to the power stage 3 of the power amplifier PA and provides the amplified envelope signal S2' to the power stage 3.

In summary, the present embodiment provides an envelope tracking power amplifier module Z including an envelope tracking module ET without a switching amplifier, thereby reducing out-of-band noise and increasing the operating bandwidth of the linear amplifier 1. In addition, since the present invention dispenses with the use of a switching amplifier, the inductor in a conventional switching amplifier can also be dispensed with, thereby enhancing the efficiency of the power amplifier PA, reducing the cost of the envelope tracking module ET and saving the space that the envelope tracking module ET would otherwise occupy.

Second Embodiment

With reference to FIG. 5, the second embodiment provides a power amplifier PA including a driver stage 2 and a power stage 3, and an envelope tracking module ET coupled to the driver stage 2 of the power amplifier PA and configured to receive and amplify an envelope signal S2 and provide the amplified envelope signal S2' to the driver stage 2. The power amplifier PA receives a signal S1 and amplifies the signal S1 according to the amplified envelope signal S2' received from the envelope tracking module ET. The difference between the present embodiment and the first embodiment is that the envelope tracking module ET of the present invention includes a switching amplifier 4.

As stated in the background of the invention, ETPAs of prior art can be divided into two types in general, two-stage ETPA and power-stage ETPA. Namely, conventional envelope tracking modules are applied to at least the power stage of a power amplifier. However, the power stage of a power amplifier demands higher current than the driver stage, resulting in narrower operating bandwidth of the envelope tracking module. The envelope tracking power amplifier module Z provided by the present embodiment is characterized in that the envelope tracking module ET is applied to the driver stage 2 of the power amplifier PA, thereby increasing the operating bandwidth of the linear amplifier 1 and thus the linearity of the envelope tracking power amplifier module Z. In addition, since the envelope tracking module ET is applied to the driver stage 1 that demands lower current from the envelope tracking module ET than the driver stage 2 does, the efficiency of the envelope tracking power amplifier module Z can thus be enhanced.

The envelope tracking module ET of the embodiment in FIG. 5 includes a linear amplifier 1 and a switching amplifier 4. However, the present invention is not limited thereto. In a varied embodiment of the present embodiment, the envelope tracking module ET can include only the linear amplifier 1, as shown in FIG. 1.

In summary, the present embodiment provides the envelope tracking power amplifier module Z that achieves higher efficiency and increased operating bandwidth by the technical solution of "the envelope tracking module ET is coupled to the driver stage 2 of the power amplifier PA and configured to receive and amplify an envelope signal S2 and provide the amplified envelope signal S2' to the driver stage 2."

Third Embodiment

Referring to FIG. 6 and FIG. 7, FIG. 6 shows the third embodiment of the present invention provides an envelope tracking method. FIG. 7 shows an envelope tracking power amplifier module Z using the method of FIG. 6. The method comprises at least the following steps. Step S200: providing a signal S1 to the power amplifier PTA; step S202: deriving an envelope phase of the signal S1, wherein the envelope phase corresponds to an output power of the power amplifier PA; step S204: providing an envelope signal S2 to the envelope tracking module ET, wherein the envelope signal S2 includes the envelope phase; step S206: the envelope tracking module ET amplifying the envelope signal S2; step S208: the envelope tracking module ET providing the amplified envelope signal S2' to the power amplifier PA; and step S210: the power amplifier PA amplifying the signal S1 according to the amplified envelope signal S1' and outputting the amplified signal at the output power.

Specifically, compared to the envelope tracking power amplifier module Z of FIG. 1 of the first embodiment, the envelope tracking power amplifier module Z of the present embodiment further includes a first signal generator 5 coupled to the power amplifier PA to provide the signal S1 to the power amplifier PA, and coupled to the linear amplifier 1 via a second signal generator 6, wherein the second signal generator 6 performs aforementioned step S202 and step S204, i.e. deriving the envelope phase of the signal S1 wherein the envelope phase corresponds to an output power of the power amplifier PA, and providing an envelope signal S2 including the envelope phase to the envelope tracking module ET.

In the present embodiment, the second signal generator 2 is configured to generate the envelope phase according to a phase shaping function. Moreover, in a varied embodiment shown in FIG. 8, the envelope tracking method of the present invention derives the envelope phase and the envelope amplitude of the signal S1 (step S302) and provide an envelope signal S2 including the envelope phase and the envelope amplitude to the envelope tracking module ET (step S304), wherein the envelope amplitude and the envelope phase are generated according to a phase shaping function and an amplitude shaping function. It should be noted that the varied embodiment shown in FIG. 8 differs from the embodiment of FIG. 6 only in step S302 and step S304, and thus the other steps of FIG. 8 will not be further described herein.

More specifically, since the nonlinearity of an ETPA leads to the in-band distortion and out-of-band intermodulation of output signals thereof, which to a significant extent is caused by the mixture of the envelope signal and the input signal having different amplitudes and phases at the power amplifier, the envelope tracking power amplifier module Z of FIG. 8 provides the envelope tracking module ET with the envelope signal S2 having an envelope amplitude and an envelope phase mapped to the amplitude and phase of the signal S1 to reduce the in-band distortion and the out-of-band intermodulation, thereby enhancing the linearity of the envelope tracking power amplifier module Z.

The way of establishing the phase shaping function and the amplitude shaping function is not limited in the present invention. Specifically, the phase shaping function can be established by measuring the linearity performance of the envelope tracking power amplifier module Z at different envelope phases for a certain output power, and then determining the envelope phase corresponding to the output power that delivers the best linearity performance. The selected envelope phases and their corresponding output powers then constitute a set of envelope phase data and a set of output power data of the phase shaping function. The phase shaping function can be stored in the second signal generator 6 so that the second signal generator 6 generates the envelope signal S2 according to the phase shaping function. In other embodiments, the phase shaping function can be established by simulation.

It should be noted that, although the envelope tracking module ET of the envelope tracking power amplifier module Z in FIG. 7 includes no switch amplifier, and the linear amplifier 1 is connected to the driver stage 2, the present embodiment is not limited thereto. In a varied embodiment of the third embodiment, the envelope tracking module ET can include a switch amplifier, and the envelope tracking module ET can be applied to the power stage 3 of the power amplifier PA.

Please refer to FIG. 9A, FIG. 9B, FIG. 10A, FIG. 10B and FIG. 10C, wherein FIG. 9A and FIG. 9B show measured phase shaping functions for the envelope tracking power amplifier module Z of FIG. 4 and that for the envelope tracking power amplifier module Z of FIG. 1. FIG. 10A to FIG. 10C respectively show measured third-order intermodulation distortions (IMD3) of a power amplifier powered by a DC power source, the embodiment of FIG. 4 using the amplitude shaping function and the phase shaping function of FIG. 9A, and the embodiment of FIG. 1 using the amplitude shaping function and the phase shaping function of FIG. 9B. As can be seen from FIG. 10A, the comparative example shows asymmetric $IMD3_L$ and $IMD3_H$. FIG. 10B shows that the envelope tracking power amplifier module Z of FIG. 4 using the phase shaping function and the amplitude shaping function exhibits improved symmetry between $IMD3_L$ and $IMD3_H$, and FIG. 10C illustrates a further improvement of balance between $IMD3_L$ and $IMD3_H$ compared to FIG. 10B. In addition, when −30 dBc IMD3 linearity limit is adopted, the envelope tracking power amplifier module Z of FIG. 4 extends the linear range to 22.7 dBm against 21.4 dBm in the case of the DC supplied power amplifier. The envelope tracking power amplifier module Z of FIG. 1 further extends the linear range to 23.5 dBm. Therefore, according to the present embodiment, the envelope tracking power amplifier module Z of FIG. 4 and FIG. 1 with the envelope tracking module ET having no switching amplifier and using amplitude and phase shaping method provide improved linearity performance. In addition, the envelope tracking power amplifier module Z of FIG. 1, with the envelope tracking module ET thereof being connected to the driver stage 2, shows larger improvement in linearity.

FIG. 11 shows measured amplitude shaping function and phase shaping function for the envelope tracking power amplifier module Z of FIG. 1 for 2.35 GHz 5G NR TDD signal with 256-QAM and 50-MHz bandwidth. FIG. 12A and FIG. 12B respectively show measured ACLR of a power amplifier powered by a DC power source and that of the envelope tracking power amplifier module Z of FIG. 1 using the amplitude shaping function and the phase shaping function shown in FIG. 11. Comparing FIG. 12B to FIG. 12A, the envelope tracking power amplifier module Z of FIG. 1 using the envelope tracking method provided by the present embodiment shows apparent improvement in ACLR symmetry. Furthermore, when taking −30 dBm as the linearity limit, the linear output power can be extended to 23.5 dBm against 21 dBm under constant power supply. In addition, FIG. 12B exhibits lower ACLR at 23.5 dBm output power than FIG. 12A.

FIG. 13 shows measured EVM of a power amplifier powered by a DC power supply (shown with the line indicated as comparison 1) and that of the envelope tracking power amplifier module Z of FIG. 1 using the amplitude shaping function and the phase shaping function of FIG. 11. FIG. 13 shows that the EVM of the present embodiment is improved by around 1.3% at the average output power of 23.5 dBm, which indicates reduced in-band distortion in the present embodiment.

FIG. 14A and FIG. 14B respectively show measured power spectra of the envelope tracking power amplifier module Z of FIG. 1 using the amplitude shaping function and the phase shaping function of FIG. 11, and the power spectrum of two other comparative examples within different frequency ranges. Specifically, the first comparative example is a power amplifier powered by a DC power source and marked as Comparison 1. The second comparative example, marked as Comparison 2, is an envelope tracking power amplifier with an envelope tracking module having a linear amplifier and a switching amplifier, in which the envelope tracking module is connected to the driver stage of the power amplifier. The envelope tracking power amplifier module Z of the present embodiment is marked as Target. FIG. 14A shows that the level of out-of-band noise caused by the switching amplifier of the second comparative example is largely reduced in FIG. 14B, where the envelope tracking power amplifier module Z includes no switching amplifier.

FIG. 14B shows partial FIG. 14A within the frequency range from 2.2 GHz to 2.5 GHz. Specifically, FIG. 14B shows that both the first comparative example and the second comparative example exhibit asymmetric ACLR performance, and the envelope tracking power amplifier module Z of the present embodiment (Target) delivers lowered and symmetric ACLR, which indicates that the envelope tracking method of the present embodiment using the amplitude shaping function and the phase shaping function plays a significant role in achieving symmetric ACLR performance. As shown in FIG. 14B, the envelope tracking method of the present embodiment prevents the output signals of the envelope tracking power amplifier module Z from interfering with transmissions on adjacent frequency bands, e.g. WiFi 802.11b/g/n shown in FIG. 14B.

In summary, the present invention provides the envelope tracking power amplifier module Z and the envelope tracking method that achieve linearity improvement by the technical solution of "deriving an envelope phase of the signal S1, wherein the envelope phase S2 corresponds to an output power of the power amplifier PA" and "providing an envelope signal S2 to the envelope tracking module ET, wherein the envelope signal S2 includes the envelope phase."

The present invention has been described with reference to the above embodiments, but the above embodiments are merely examples for implementing the present invention. It should be noted that the disclosed embodiments are not intended to limit the scope of the present invention. On the contrary, any modification and equivalent configuration within the spirit and scope of the appended claims shall fall within the scope of the present invention.

[Non-patent citation 1] W.-T. Tsai, C.-Y. Liou, Z.-A. Peng, and S.-G Mao, "Wide-bandwidth and high-linearity envelope-tracking front-end module for LTE-A carrier aggregation applications," IEEE Trans. Microw. Theory Techn., vol. 65, no. 11, pp. 4657-4668, November 2017.

What is claimed is:

1. An envelope tracking power amplifier module, comprising:
   a power amplifier; and
   a linear amplifier coupled to the power amplifier and configured to receive and amplify an envelope signal and provide the amplified envelope signal to the power amplifier,
   wherein the power amplifier is configured to receive and amplify a signal according to the amplified envelope signal; the linear amplifier includes an input stage, an amplification stage and an output stage, wherein the input stage includes at least one pair of input transistors, and the amplification stage includes at least one pair of amplification transistors in parallel connection with each other, and wherein one pair of the input transistors of the input stage is in direct-cascade connection and cross-cascade connection with one pair of the amplification transistors of the amplification stage such that an input signal flowing through a left transistor of said pair of input transistors passes through a right transistor of said pair of amplification transistors, and another input signal flowing through a right transistor of said pair of input transistors passes through a left transistor of said pair of amplification transistors.

2. The envelope tracking power amplifier module according to claim 1, wherein the envelope signal includes an envelope phase corresponding to an output power at which the power amplifier outputs the amplified signal.

3. The envelope tracking power amplifier module according to claim 2, further comprising a signal generator respectively coupled to the power amplifier and the linear amplifier, wherein the signal generator is configured to generate the envelope phase according to a phase shaping function and provide the envelope signal including the envelope phase to the linear amplifier.

4. The envelope tracking power amplifier module according to claim 3, wherein the phase shaping function includes a set of output power data and a set of envelope phase data as the parameters of the phase shaping function.

5. The envelope tracking power amplifier module according to claim 2, wherein the signal generator is further configured to generate an envelope amplitude according to an amplitude shaping function and provide the envelope signal including the envelope amplitude to the linear amplifier.

6. The envelope tracking power amplifier module according to claim 1, wherein the power amplifier includes a driver stage and a power stage, the linear amplifier being coupled to the driver stage and providing the amplified envelope signal to the driver stage.

7. The envelope tracking power amplifier module according to claim 1, wherein the operational bandwidth of the linear amplifier is 536 MHz.

8. An envelope tracking method for an envelope tracking power amplifier module including a power amplifier and a linear amplifier, the linear amplifier being coupled to the power amplifier, the method comprising:
   providing a signal to the power amplifier;
   providing an envelope signal to the linear amplifier;
   the linear amplifier amplifying the envelope signal;
   the linear amplifier providing the amplified envelope signal to the power amplifier; and
   the power amplifier amplifying the signal according to the amplified envelope signal,
   wherein the linear amplifier includes an input stage, an amplification stage and an output stage, the input stage includes at least one pair of input transistors, and the amplification stage includes at least one pair of amplification transistors in parallel connection with each other, and wherein one pair of the input transistors of the input stage is in direct-cascade connection and cross-cascade connection with one pair of the amplification transistors of the amplification stage such that an input signal flowing through a left transistor of said pair of input transistors passes through a right transistor of said pair of amplification transistors, and another input signal flowing through a right transistor of said pair of input transistors passes through a left transistor of said pair of amplification transistors.

9. The method according to claim 8, wherein the power amplifier includes a driver stage and a power stage, the linear amplifier being coupled to the driver stage, and wherein the step of the linear amplifier providing the amplified envelope signal to the power amplifier includes:
   the linear amplifier providing the amplified envelope signal to the driver stage of the power amplifier.

10. The method according to claim 8, wherein the step of providing an envelope signal to the linear amplifier further includes:
    deriving an envelope phase of the signal; and
    providing the envelope signal including the envelope phase to the linear amplifier,
    wherein the envelope phase corresponds to an output power at which the power amplifier outputs the amplified signal.

11. The method according to claim 10, wherein the step of deriving the envelope phase of the signal further includes:
    deriving the envelope phase according to a phase shaping function,
    wherein the phase shaping function includes a set of output power data and a set of envelope phase data as the parameters of the phase shaping function.

* * * * *